United States Patent
Fujii

(10) Patent No.: US 10,916,654 B2
(45) Date of Patent: Feb. 9, 2021

(54) SEMICONDUCTOR MEMORY DEVICE

(71) Applicant: Toshiba Memory Corporation, Minato-ku (JP)

(72) Inventor: Shosuke Fujii, Kuwana (JP)

(73) Assignee: Toshiba Memory Corporation, Minato-ku (JP)

( * ) Notice: Subject to any disclaimer, the term of this patent is extended or adjusted under 35 U.S.C. 154(b) by 0 days.

(21) Appl. No.: 16/549,540

(22) Filed: Aug. 23, 2019

(65) Prior Publication Data
US 2020/0303558 A1 Sep. 24, 2020

(30) Foreign Application Priority Data
Mar. 20, 2019 (JP) .................... 2019-053681

(51) Int. Cl.
| | | |
|---|---|---|
| H01L 29/78 | (2006.01) | |
| H01L 27/11 | (2006.01) | |
| G11C 5/06 | (2006.01) | |
| H01L 27/11524 | (2017.01) | |
| H01L 27/1157 | (2017.01) | |
| (Continued) | | |

(52) U.S. Cl.
CPC ........ H01L 29/78391 (2014.09); G11C 5/063 (2013.01); H01L 27/1157 (2013.01);
(Continued)

(58) Field of Classification Search
CPC ... H01L 29/78; H01L 29/78391; H01L 27/11; H01L 27/115; H01L 27/1157;
(Continued)

(56) References Cited

U.S. PATENT DOCUMENTS 6,642,563 B2 11/2003 Kanaya
6,750,501 B2 6/2004 Tarui et al.
(Continued)

FOREIGN PATENT DOCUMENTS

JP 2002-110932 A 4/2002
JP 2002-313966 A 10/2002
(Continued)

OTHER PUBLICATIONS

Shinji Migita et al., "Assessment of Steep-Subthreshold Swing Behaviors in Ferroelectric-Gate Field-Effect Transistors Caused by Positive Feedback of Polarization Reversal", IEDM18, IEEE, 2018, pp. 719-722.
(Continued)

*Primary Examiner* — Fazli Erdem
(74) *Attorney, Agent, or Firm* — Oblon, McClelland, Maier & Neustadt, L.L.P.

(57) ABSTRACT

The semiconductor memory device of the embodiment includes a stacked body including interlayer insulating layers and gate electrode layers alternately stacked in a first direction; a semiconductor layer provided in the stacked body and extending in the first direction; a first insulating layer provided between the semiconductor layer and the gate electrode layers; conductive layers provided between the first insulating layer and the gate electrode layers; and second insulating layers provided between the conductive layers and the gate electrode layers and the second insulating layers containing ferroelectrics. Two of the conductive layers adjacent to each other in the first direction are separated by one of the interlayer insulating layers interposed between the two of the conductive layers, and a first thickness of one of the gate electrode layers in the first direction is smaller than a second thickness of one of the conductive layers in the first direction.

20 Claims, 13 Drawing Sheets

(51) Int. Cl.
  *H01L 27/11582* (2017.01)
  *H01L 27/11556* (2017.01)
  *G11C 11/22* (2006.01)
  *H01L 27/11585* (2017.01)

(52) U.S. Cl.
  CPC .. *H01L 27/11524* (2013.01); *H01L 27/11556* (2013.01); *H01L 27/11582* (2013.01); *G11C 11/223* (2013.01); *H01L 27/11585* (2013.01)

(58) Field of Classification Search
  CPC ......... H01L 27/11524; H01L 27/11556; H01L 27/11582; G11C 5/063
  USPC ....................................................... 257/295
  See application file for complete search history.

(56) References Cited

U.S. PATENT DOCUMENTS

| | | | |
|---|---|---|---|
| 6,828,160 B2 | 12/2004 | Liu | |
| 9,818,468 B2 | 11/2017 | Mueller | |
| 10,062,426 B2 | 8/2018 | Karda et al. | |
| 10,084,084 B2 | 9/2018 | Ramaswamy et al. | |
| 2003/0067022 A1* | 4/2003 | Sakai | H01L 29/78391 257/295 |
| 2015/0179657 A1 | 6/2015 | Inumiya | |

FOREIGN PATENT DOCUMENTS

| | | |
|---|---|---|
| JP | 2003-158244 A | 5/2003 |
| KR | 10-1872122 B1 | 6/2018 |

OTHER PUBLICATIONS

Hiroshi Ishiwara, "Recent Progress in FET-type Ferroelectric Memories", IEEE, 2003, 4 pages.

Krishna Parat, et al., "A Floating Gate Based 3D NAND Technology With CMOS Under Array", IEDM15, pp. 48-51.

* cited by examiner

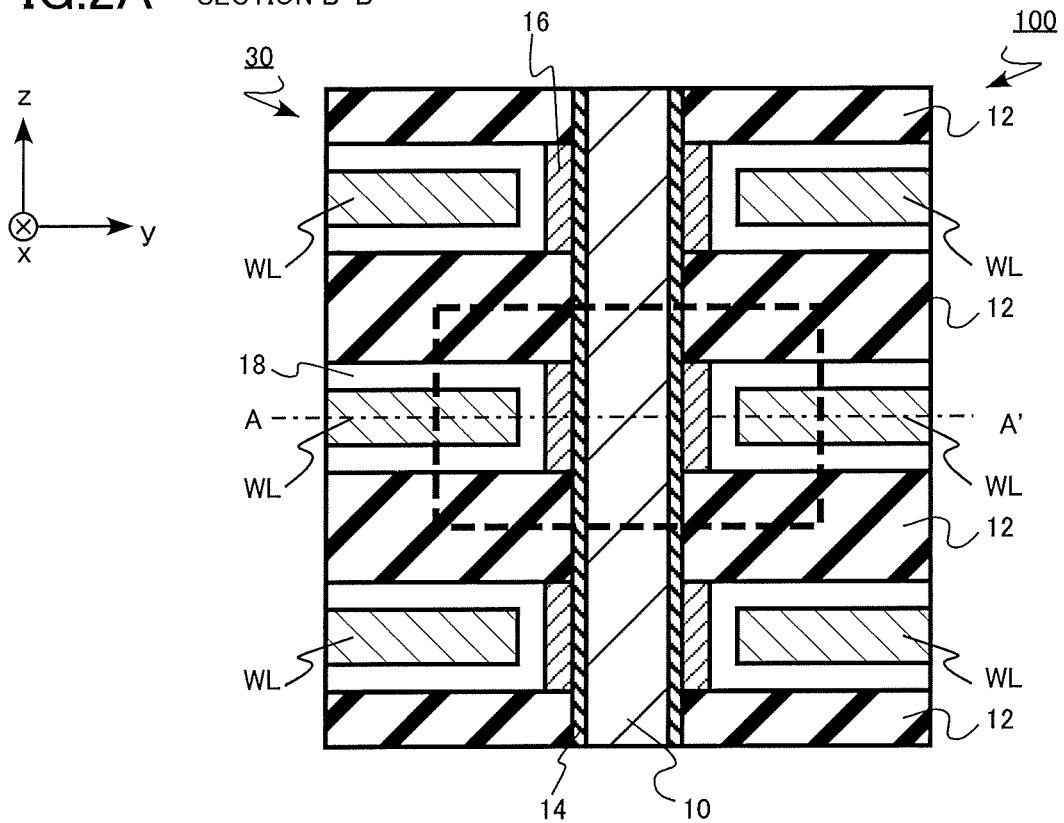
FIG.2A  SECTION B-B'
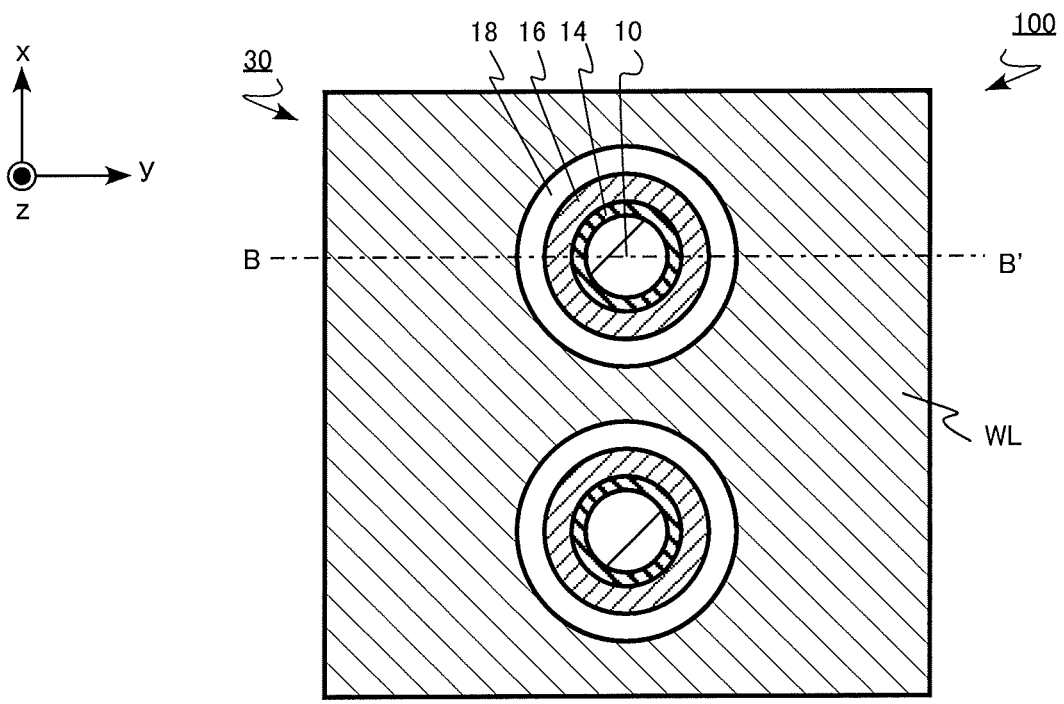
FIG.2B  SECTION A-A'

SEMICONDUCTOR MEMORY DEVICE

CROSS-REFERENCE TO RELATED APPLICATION

This application is based upon and claims the benefit of priority from Japanese Patent Application No. 2019-053681, filed on Mar. 20, 2019, the entire contents of which are incorporated herein by reference.

FIELD

Embodiments described herein relate generally to a semiconductor memory device.

BACKGROUND

Ferroelectric memory is attracting attention as nonvolatile memory. In particular, one-transistor-type memory cells of a metal ferroelectrics insulator semiconductor (MFIS) structure or a metal ferroelectrics metal insulator semiconductor (MFMIS) structure can be highly integrated, and thus their application to large-capacity nonvolatile memory is expected.

In the ferroelectric memory, degradation of charge retention characteristics due to polarization instability is a problem. It is desirable to increase the polarization stability of the ferroelectric memory to improve the reliability of the ferroelectric memory.

BRIEF DESCRIPTION OF THE DRAWINGS

FIGS. 2A and 2B are schematic cross-sectional views of the memory cell array of the semiconductor memory device of the embodiment;

DETAILED DESCRIPTION

Figure 1:
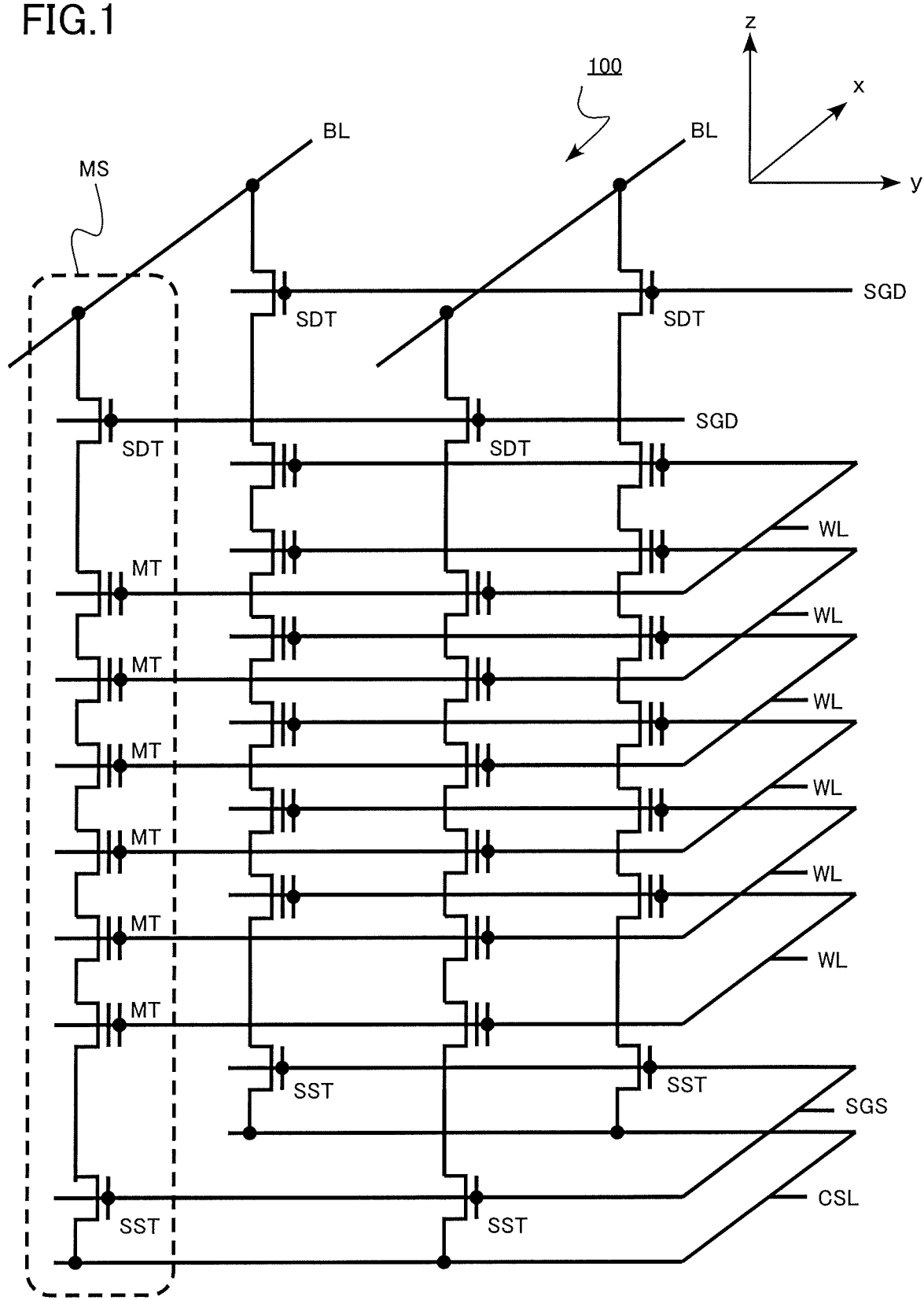
FIG. 1 is a circuit diagram of a memory cell array of a semiconductor memory device of an embodiment.

Hereinafter, an embodiment of the present disclosure will be described with reference to the drawings. In the following description, the same reference numerals are assigned to the same or similar members and others, and explanations of members and others once described is omitted as appropriate.

In the present specification, the term "upper" or "lower" may be used for convenience. The term "upper" or "lower" is a term simply indicating a relative positional relationship in the drawings, and is not a term defining a positional relationship with respect to gravity.

Qualitative analysis and quantitative analysis of the chemical compositions of members constituting a semiconductor device in the present specification can be performed, for example, by secondary ion mass spectrometry (SIMS), or energy dispersive X-ray spectroscopy (EDX). For the measurement of the thicknesses of the members constituting the semiconductor device, the distances between the members, and the like, a transmission electron microscope (TEM), for example, can be used. For the identification of the crystal systems of the members constituting the semiconductor memory device, nano beam diffraction (NBD), for example, can be used.

The semiconductor memory device of the embodiment includes a stacked body including interlayer insulating layers and gate electrode layers alternately stacked in a first direction; a semiconductor layer provided in the stacked body and extending in the first direction; a first insulating layer provided between the semiconductor layer and the gate electrode layers; conductive layers provided between the first insulating layer and the gate electrode layers; and second insulating layers provided between the conductive layers and the gate electrode layers and the second insulating layers containing ferroelectrics. Two of the conductive layers adjacent to each other in the first direction are separated by one of the interlayer insulating layers interposed between the two of the conductive layers. A first thickness of one of the gate electrode layers in the first direction is smaller than a second thickness of one of the conductive layers in the first direction.

The semiconductor memory device of the embodiment is a three-dimensional NAND flash memory including memory cell transistors MT of the MFMIS structure.

FIG. 1 is a circuit diagram of a memory cell array of the semiconductor memory device of the embodiment.

As shown in FIG. 1, the memory cell array 100 of the three-dimensional NAND flash memory of the embodiment includes a plurality of word lines WL (gate electrode layers), a common source line CSL, a source select gate line SGS, a plurality of drain select gate lines SGD, a plurality of bit lines BL (semiconductor layers), and a plurality of memory strings MS.

The word lines WL are disposed in a z direction (first direction). The bit lines BL extend in the z direction. Hereinafter, a y direction orthogonal to the z direction is referred to as a second direction, and an x direction orthogonal to the z direction and the y direction is referred to as a third direction.

As shown in FIG. 1, each memory string MS includes a source select transistor SST, a plurality of memory cell transistors MT, and a drain select transistor SDT connected in series between the common source line CSL and the bit line BL. One of the memory strings MS can be selected by the bit line BL and the drain select gate line SGD, and one of the memory cell transistors MT can be selected by the word line WL.

FIGS. 2A and 2B are schematic cross-sectional views of the memory cell array of the semiconductor memory device of the embodiment. FIGS. 2A and 2B show cross sections of memory cells in one of the memory strings MS enclosed by a dotted line, for example, in the memory cell array 100 in FIG. 1.

FIG. 2A is a cross-sectional view of the memory cell array 100 taken along the y-z directions. FIG. 2A is a cross section taken along the line B-B' of FIG. 2B. FIG. 2B is a cross-sectional view of the memory cell array 100 taken along the x-y directions. FIG. 2B is a cross section taken along the line A-A' of FIG. 2A. In FIG. 2A, a region enclosed by a broken line is one memory cell MC.

Figure 3:
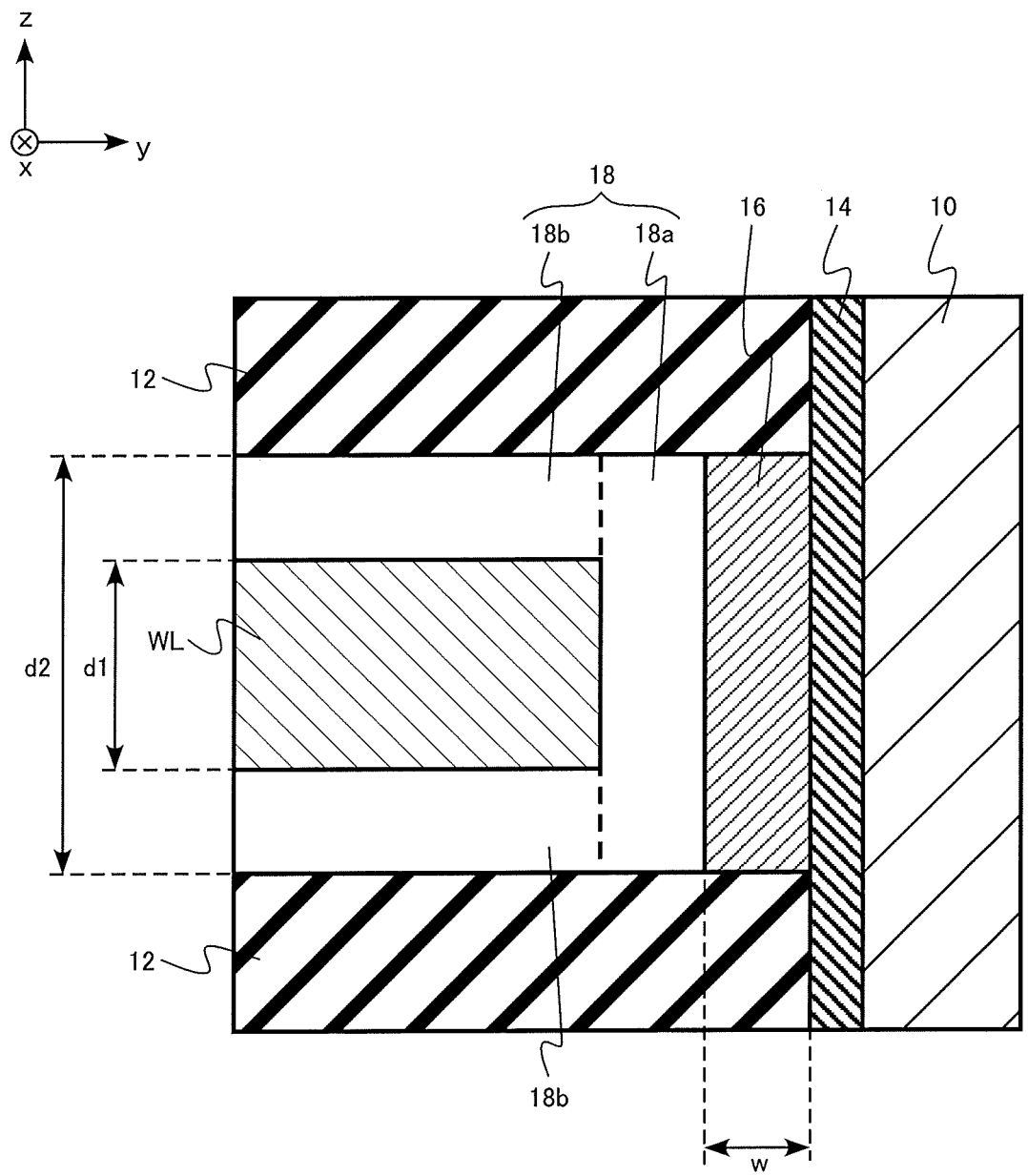
FIG. 3 is a schematic cross-sectional view of a memory cell of the semiconductor memory device of the embodiment.

FIG. 3 is a schematic cross-sectional view of a memory cell of the semiconductor memory device of the embodiment. FIG. 3 is an enlarged cross-sectional view of a part of the memory cell.

As shown in FIGS. 2A, 2B and 3, the memory cell array 100 includes the word lines WL (gate electrode layers), a semiconductor layer 10, a plurality of interlayer insulating layers 12, a gate insulating layer 14 (first insulating layer), metal layers 16 (conductive layers), and ferroelectric layers 18 (second insulating layers). The word lines WL and the interlayer insulating layers 12 constitute a stacked body 30. The ferroelectric layers 18 each include a ferroelectric region 18a (first region) and paraelectric regions 18b (second regions).

The word lines WL and the interlayer insulating layers 12 are provided, for example, on a semiconductor substrate (not shown).

The word lines WL and the interlayer insulating layers 12 are alternately stacked in the z direction (first direction) on the semiconductor substrate. The word lines WL are spaced apart and disposed in the z direction. The word lines WL and the interlayer insulating layers 12 constitute a stacked body 30.

The word lines WL are plate-shaped conductors. The word lines WL are, for example, a metal, a metal nitride, a metal carbide, or a semiconductor. The word lines WL are, for example, tungsten (W). The word lines WL function as control electrodes of the memory cell transistors MT. The word lines WL are an example of the gate electrode layers.

The interlayer insulating layers 12 provide isolation between the word lines WL. The interlayer insulating layers 12 are, for example, an oxide, an oxynitride, or a nitride. The interlayer insulating layers 12 are, for example, silicon oxide.

The semiconductor layer 10 is provided in the stacked body 30. The semiconductor layer 10 extends in the z direction. The semiconductor layer 10 is provided through the stacked body 30. The semiconductor layer 10 is, for example, cylindrical.

The semiconductor layer 10 is, for example, a polycrystalline semiconductor. The semiconductor layer 10 is, for example, polycrystalline silicon. The semiconductor layer 10 functions as a channel of the memory cell transistors MT.

The gate insulating layer 14 is provided between the semiconductor layer 10 and the word lines WL. The gate insulating layer 14 is provided between the semiconductor layer 10 and the metal layers 16.

The gate insulating layer 14 is provided along the side surface of the semiconductor layer 10. The gate insulating layer 14 is also provided between the semiconductor layer 10 and the interlayer insulating layers 12. The gate insulating layer 14 is provided without being divided between the memory cell transistors MT adjacent to each other.

The gate insulating layer 14 is, for example, an oxide or oxynitride. The gate insulating layer 14 is, for example, silicon oxide.

The thickness of the gate insulating layer 14 in the y direction is, for example, 1 nm or more and 10 nm or less.

The metal layers 16 are provided between the gate insulating layer 14 and the word lines WL. The metal layers 16 are provided between the gate insulating layer 14 and the ferroelectric layers 18.

Two of the metal layers 16 adjacent to each other in the z direction are separated by the interlayer insulating layer 12 interposed between the two metal layers 16. The metal layers 16 of the memory cell transistors MT adjacent to each other in the z direction are divided.

The metal layers 16 are, for example, a metal, a metal nitride, or a metal carbide. The metal layers 16 contain, for example, at least one material selected from the group consisting of titanium (Ti), tungsten (W), tantalum (Ta), titanium nitride, tungsten nitride, tantalum nitride, titanium carbide, tungsten carbide, and tantalum carbide. The metal layers 16 are, for example, titanium nitride.

The thickness of each metal layer 16 in the y direction is, for example, 3 nm or more and 15 nm or less.

Each ferroelectric layer 18 is provided between the metal layer 16 and the word line WL. Each ferroelectric layer 18 is in contact, for example, with the metal layer 16 and the word line WL.

The ferroelectric layers 18 each include a ferroelectric region 18a (first region) and paraelectric regions 18b (second regions). The ferroelectric region 18a is provided between the metal layer 16 and the word line WL. The paraelectric regions 18b are provided between the word line WL and the interlayer insulating layers 12. The paraelectric regions 18b are provided in the z direction of the word line WL. For example, the paraelectric regions 18b are in contact with the interlayer insulating layers 12. The ferroelectric region 18a and the paraelectric regions 18b have substantially the same chemical composition. The ferroelectric layers 18 contain ferroelectrics. The ferroelectric regions 18a include the ferroelectrics. The ferroelectric regions 18a contain an orthorhombic crystal. The paraelectric regions 18b contain paraelectrics. The paraelectric regions 18b contain a monoclinic crystal.

The ferroelectric layers 18 contain, for example, hafnium oxide. The ferroelectric layers 18 contain hafnium oxide as the main component. Containing hafnium oxide as the main component means that the molar ratio of hafnium oxide is the highest among substances contained in the ferroelectric layers 18. The molar ratio of hafnium oxide is, for example, 60% or more.

Hafnium oxide constituting the ferroelectric layers 18 may contain, for example, at least one element selected from the group consisting of silicon (Si), zirconium (Zr), aluminum (Al), yttrium (Y), strontium (Sr), lanthanum (La), samarium (Sm), gadolinium (Gd), terbium (Tb), dysprosium (Dy), holmium (Ho), erbium (Er), ytterbium (Yb), lutetium (Lu), and barium (Ba). By containing the above element, hafnium oxide tends to exhibit ferroelectricity.

The ferroelectric regions 18a contain, for example, ferroelectric hafnium oxide. The ferroelectric regions 18a contain, for example, an orthorhombic hafnium oxide crystal. The ferroelectric regions 18a are, for example, hafnium oxide mainly composed of orthorhombic hafnium oxide. Hafnium oxide is, for example, hafnium oxide mainly composed of the third orthorhombic crystal system (orthorhombic III, space group Pbc2$_1$, space group number 29).

The paraelectric regions 18$b$ contain, for example, paraelectric hafnium oxide. The paraelectric regions 18$b$ contain, for example, a monoclinic hafnium oxide crystal. The paraelectric regions 18$b$ are, for example, hafnium oxide mainly composed of monoclinic hafnium oxide.

A first thickness of each word line WL in the z direction (d1 in FIG. 3) is smaller than a second thickness of each metal layer 16 in the z direction (d2 in FIG. 3).

When the ferroelectric layers 18 contain hafnium oxide, the following inequality, for example, holds between the first thickness d1 (nm) of each word line WL in the z direction and the second thickness d2 (nm) of each metal layer 16 in the z direction. The following inequality may be satisfied.

$$d2 \geq d1+10$$

The first thickness d1 of each word line WL in the z direction is, for example, 5 nm or more and 40 nm or less. The second thickness d2 of each metal layer 16 in the z direction is, for example, 15 nm or more and 50 nm or less.

The thickness of each ferroelectric layer 18 in the y direction is, for example, 5 nm or more and 15 nm or less.

The width(length) of each metal layer 16 in the y direction (w in FIG. 3) is substantially constant. The metal layers 16 are not present in the first direction at the ends of the word lines WL near the semiconductor layer 10. The metal layers 16 are not present between the word lines WL and the interlayer insulating layers 12.

In each memory cell of the embodiment, the polarization-inverted state of the ferroelectric contained in the ferroelectric layer 18 is controlled by voltage applied between the word line WL and the semiconductor layer 10. Depending on the polarization-inverted state of the ferroelectric layer 18, the threshold voltage of the memory cell transistor MT changes. By the change of the threshold voltage of the memory cell transistor MT, ON-state current of the memory cell transistor MT changes. For example, if a state in which the threshold voltage is high and the ON-state current is low is defined as data "0," and a state in which the threshold voltage is low and the ON-state current is high is defined as data "1," the memory cell can store one-bit data of "0" or "1."

Next, an example of a method of manufacturing the semiconductor memory device of the embodiment will be described. FIGS. 4, 5, 6, 7, 8, 9, 10, 11 and 12 are schematic cross-sectional views showing the method of manufacturing the semiconductor memory device of the embodiment. FIGS. 4, 5, 6, 7, 8, 9, 10, 11 and 12 each show a cross section corresponding to FIG. 2A. FIGS. 4, 5, 6, 7, 8, 9, 10, 11, and 12 show an example of a method of manufacturing the memory cell array 100 of the semiconductor memory device.

Figure 4:
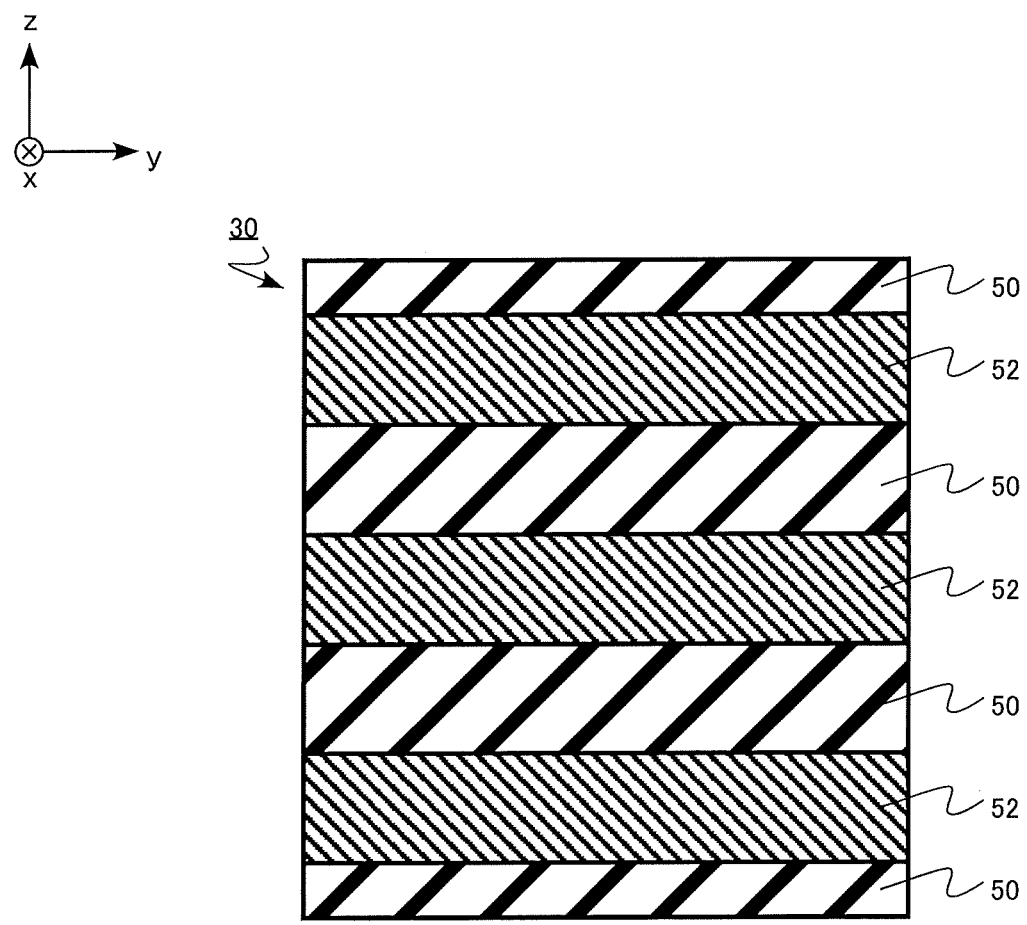
FIG. 4 is a schematic cross-sectional view showing a method of manufacturing the semiconductor memory device of the embodiment.

First, silicon oxide layers 50 and silicon nitride layers 52 are alternately stacked on a semiconductor substrate (not shown) (FIG. 4). The silicon oxide layers 50 and the silicon nitride layers 52 form the stacked body 30. The silicon oxide layers 50 and the silicon nitride layers 52 are formed, for example, by a chemical vapor deposition method (CVD method). Parts of the silicon oxide layers 50 finally become the interlayer insulating layers 12.

Figure 5:
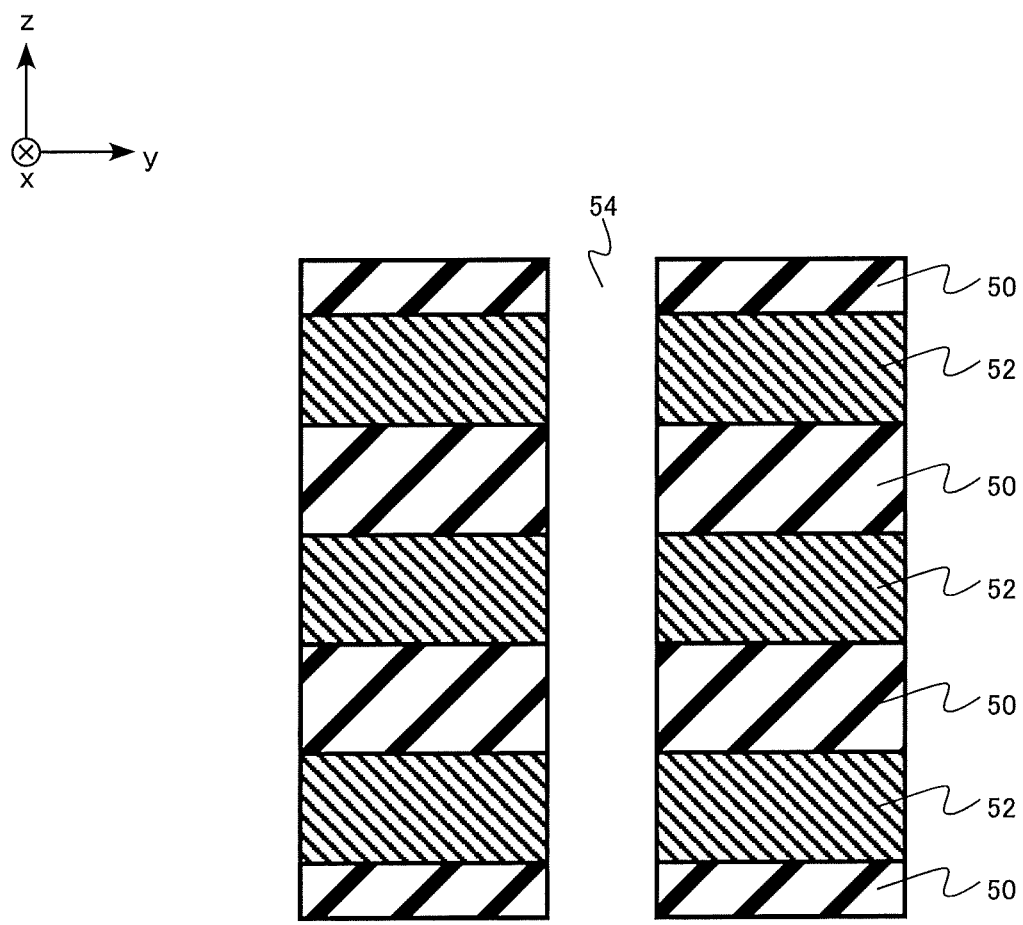
FIG. 5 is a schematic cross-sectional view showing the method of manufacturing the semiconductor memory device of the embodiment.

Next, an opening 54 is formed in the silicon oxide layers 50 and the silicon nitride layers 52 (FIG. 5). The opening 54 is formed, for example, by a lithography method and a reactive ion etching method (RIE method).

Figure 6:
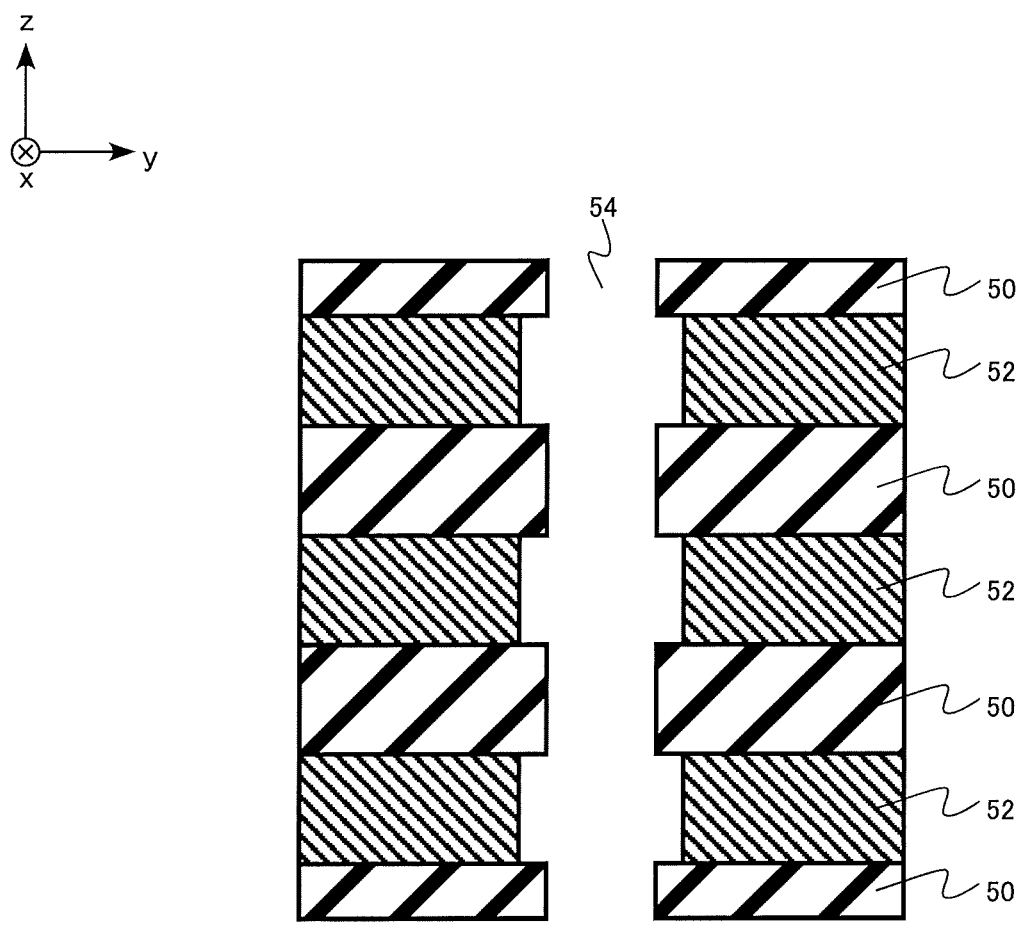
FIG. 6 is a schematic cross-sectional view showing the method of manufacturing the semiconductor memory device of the embodiment.

Next, the silicon nitride layers 52 exposed at the inner surface of the opening 54 are selectively retreated by wet etching (FIG. 6). The wet etching uses, for example, a phosphoric acid solution. The silicon nitride layers 52 are selectively etched with respect to the silicon oxide layers 50.

Figure 7:
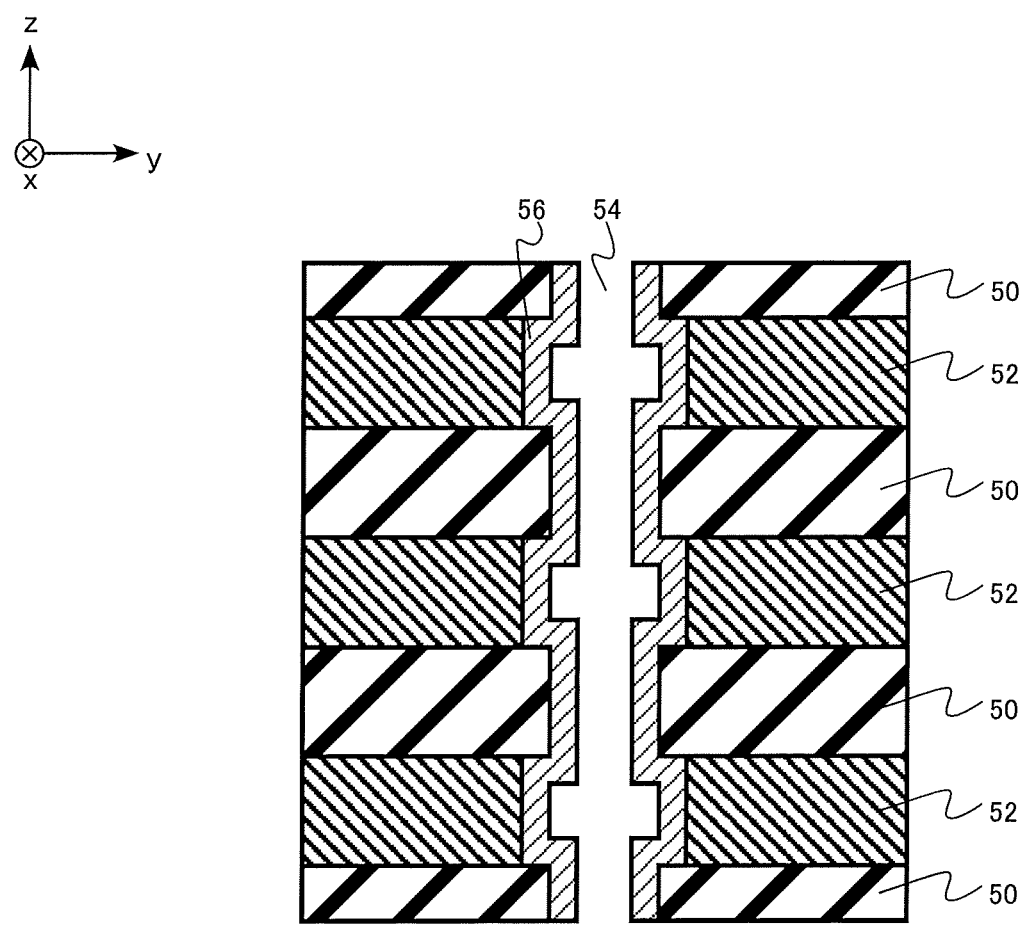
FIG. 7 is a schematic cross-sectional view showing the method of manufacturing the semiconductor memory device of the embodiment.

Next, a titanium nitride film 56 is formed in the opening 54 and in regions from which the silicon nitride layers 52 are retreated (FIG. 7). The titanium nitride film 56 is formed, for example, by an atomic layer deposition method (ALD method). Parts of the titanium nitride film 56 finally become the metal layers 16.

Figure 8:
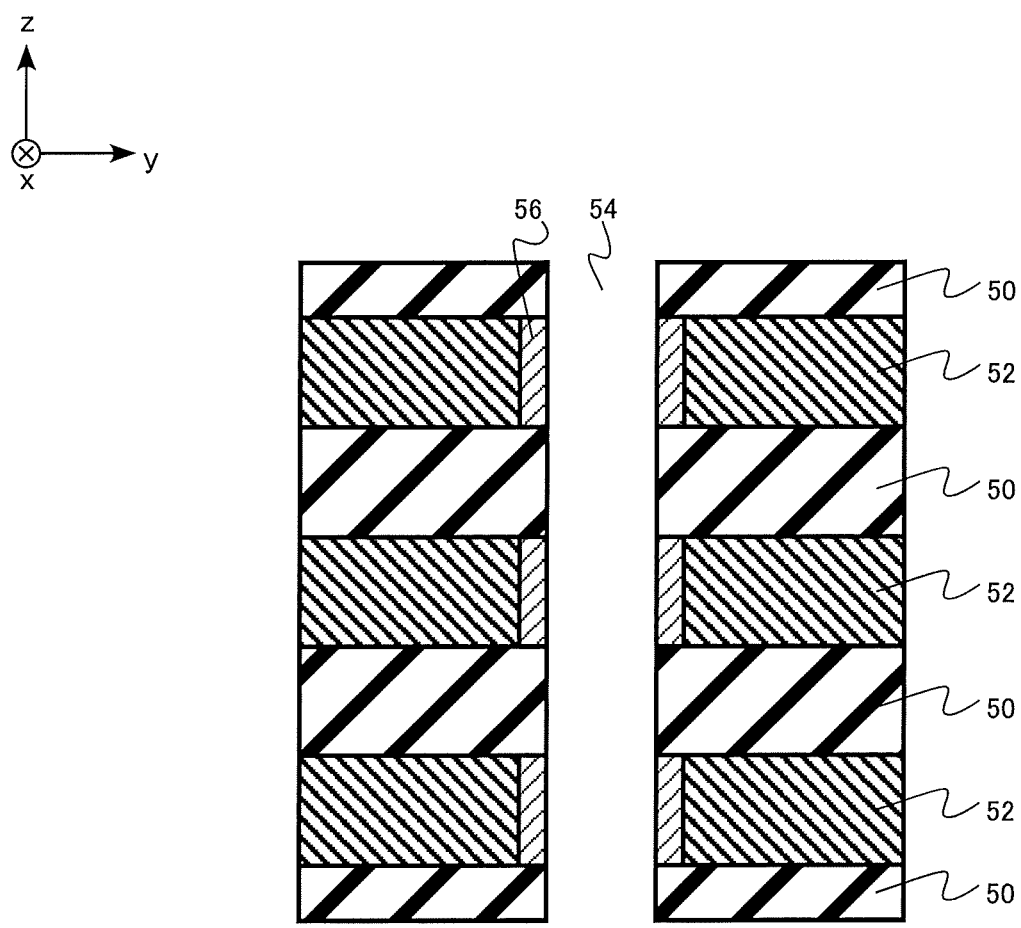
FIG. 8 is a schematic cross-sectional view showing the method of manufacturing the semiconductor memory device of the embodiment.

Next, the titanium nitride film 56 on the inner surface of the opening 54 is removed by etching (FIG. 8). The titanium nitride film 56 is etched and removed, for example, by an RIE method.

Figure 9:
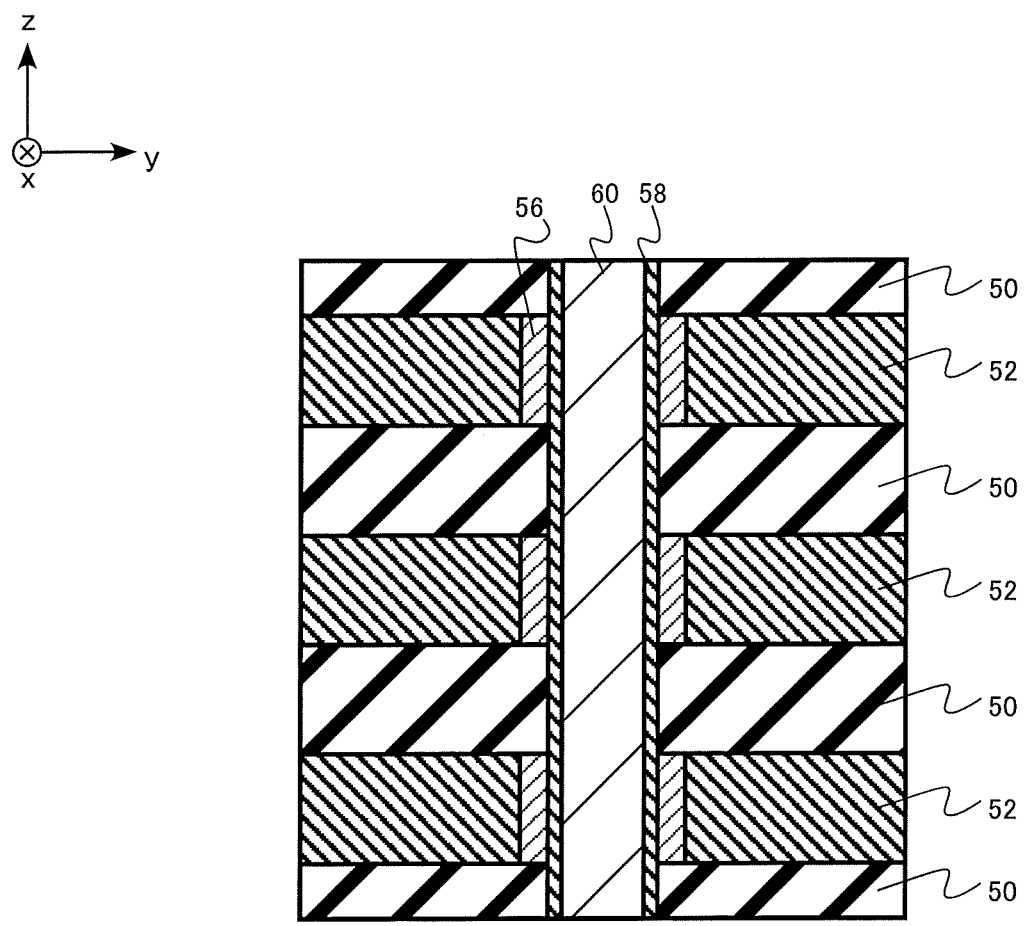
FIG. 9 is a schematic cross-sectional view showing the method of manufacturing the semiconductor memory device of the embodiment.

Next, a silicon oxide film 58 is formed in the opening 54. Then, a polycrystalline silicon film 60 is formed on the silicon oxide film 58 to fill the opening 54 (FIG. 9). The silicon oxide film 58 and the polycrystalline silicon film 60 are formed, for example, by a CVD method.

Figure 10:
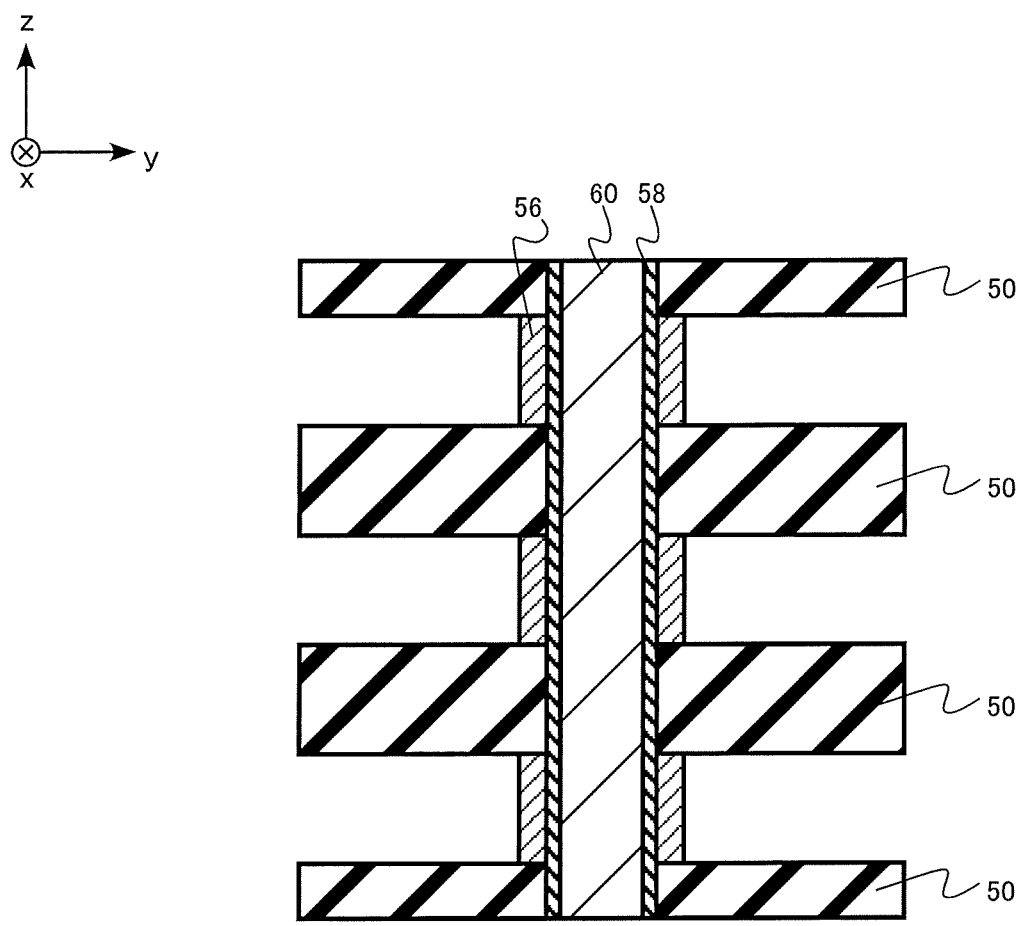
FIG. 10 is a schematic cross-sectional view showing the method of manufacturing the semiconductor memory device of the embodiment.

Next, the silicon nitride layers 52 are selectively removed by wet etching, using etching grooves (not shown) (FIG. 10). The wet etching uses, for example, a phosphoric acid solution. The silicon nitride layers 52 are selectively etched with respect to the silicon oxide layers 50 and the titanium nitride films 56.

Figure 11:
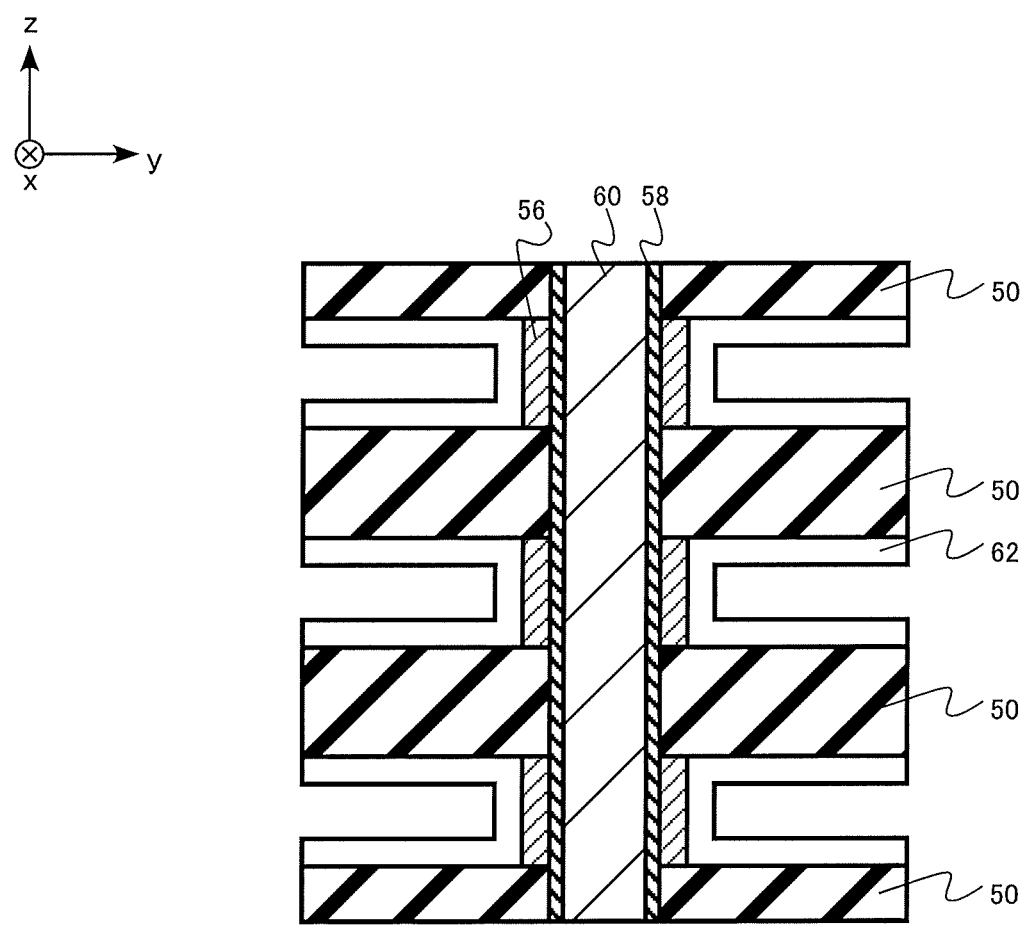
FIG. 11 is a schematic cross-sectional view showing the method of manufacturing the semiconductor memory device of the embodiment.

Next, hafnium oxide films 62 are formed in regions from which the silicon nitride layers 52 are removed (FIG. 11). The hafnium oxide films 62 are formed, for example, by an ALD method. The hafnium oxide films 62 finally become the ferroelectric layers 18.

Figure 12:
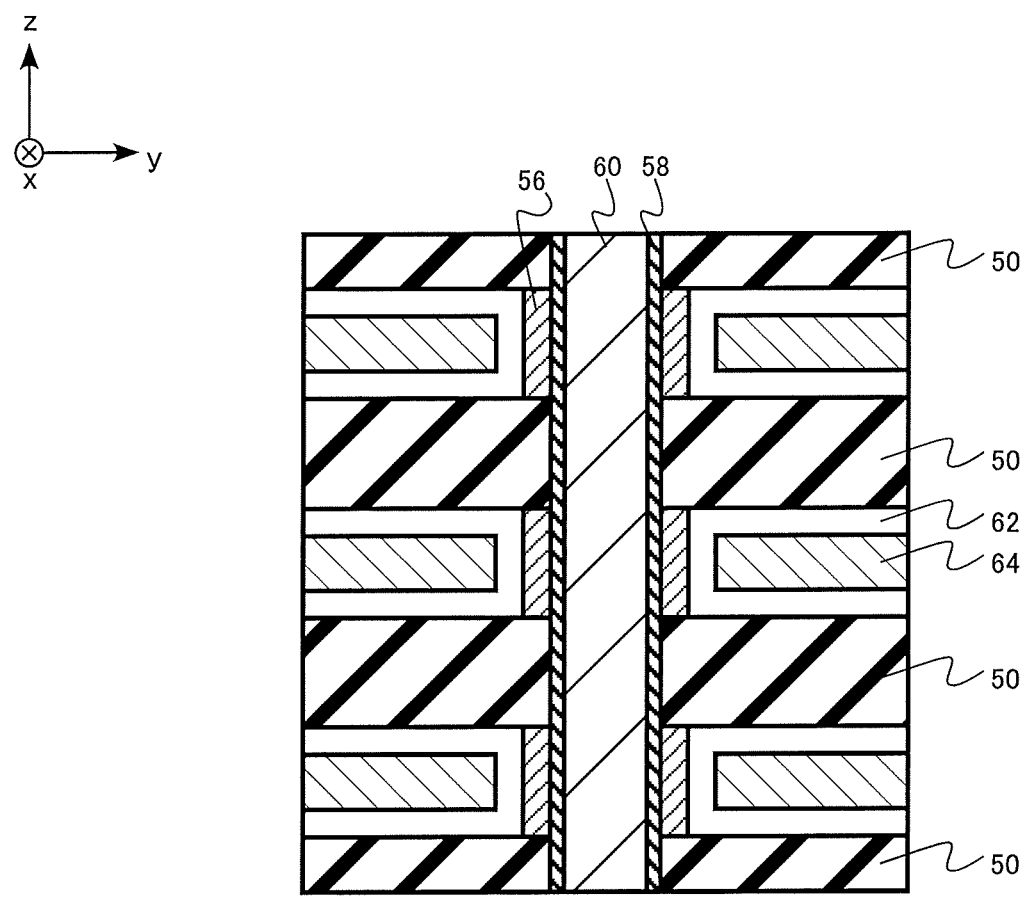
FIG. 12 is a schematic cross-sectional view showing the method of manufacturing the semiconductor memory device of the embodiment.

Next, tungsten films 64 are formed on the hafnium oxide films 62 (FIG. 12). The tungsten films 64 are formed, for example, by a CVD method. The tungsten films 64 finally become the word lines WL.

After the formation of the tungsten films 64, crystallization annealing is performed. By the crystallization annealing, regions of the hafnium oxide films 62 sandwiched between the tungsten films 64 and the titanium nitride films 56 become ferroelectric. These regions constitute the ferroelectric regions 18$a$. On the other hand, regions of the hafnium oxide films 62 sandwiched between the tungsten films 64 and the silicon oxide layers 50 become paraelectric. These regions constitute the paraelectric regions 18$b$.

By the above manufacturing method, the memory cell array 100 of the semiconductor memory device of the embodiment is manufactured.

Next, the function and effect of the semiconductor memory device of the embodiment will be described.

In a one-transistor-type memory cell of the MFIS structure or the MFMIS structure, degradation of charge retention characteristics due to polarization instability is a problem. The cause of this is considered to be that a depolarization electric field produced by the presence of the insulating layers between the gate electrode and the semiconductor layer leaves a polarization domain that cannot be inverted in the ferroelectric layer. If there is a polarization domain that cannot be inverted in the ferroelectric layer, it is considered that the polarization of the ferroelectric layer becomes unstable, degrading the charge retention characteristics.

The MFMIS structure is a structure in which an MFM capacitor and an MIS capacitor are connected in series between the gate electrode and the semiconductor layer. By making the area of the MFM capacitor smaller than the area of the MIS capacitor, it is possible to weaken the depolarization electric field and improve the charge retention characteristics.

In the semiconductor memory device of the embodiment, the word line WL, the ferroelectric layer 18, and the metal layer 16 constitute an MFM capacitor. The metal layer 16, the gate insulating layer 14, and the semiconductor layer 10 constitute a MIS capacitor.

In the semiconductor memory device of the embodiment, the first thickness of the word line WL in the z direction (d1 in FIG. 3) is smaller than the second thickness of the metal layer 16 in the z direction (d2 in FIG. 3). Thus, the area of the MFM capacitor formed of the word line WL, the ferroelectric layer 18, and the metal layer 16 is smaller than the area of the MIS capacitor formed of the metal layer 16, the gate insulating layer 14, and the semiconductor layer 10. Consequently, it is possible to weaken the depolarization electric field and improve the charge retention characteristics.

Further, from the viewpoint of weakening the depolarization electric field and improving charge retention characteristics, a memory window MWv determined by the coercive electric field of the ferroelectric layer 18 is preferably made larger than a memory window MWp determined by the polarization quantity of the ferroelectric layer 18. That is, MWv≥MWp is preferable.

The memory window MWv determined by the coercive electric field is expressed by the following formula (1). The memory window MWp determined by the polarization quantity is expressed by the following formula (2).

$$MW_V = \Delta V_{fb} \approx 2 \cdot V_c = 2 \cdot E_c \cdot t_{FE} \quad (1)$$

$$MW_P = \Delta V_{fb} = \frac{(P_r \cdot s) t_{FE}}{\varepsilon_0 \varepsilon} \quad (2)$$

In formulas (1) and (2), Ec is the coercive electric field, $t_{FE}$ is the film thickness of the ferroelectric layer, Pr is the remanent polarization, ε is the dielectric constant of the ferroelectric layer, and s is the MFM capacitor area/the MIS capacitor area. For the semiconductor memory device of the embodiment, s can be approximated by d1/d2.

Figure 13:
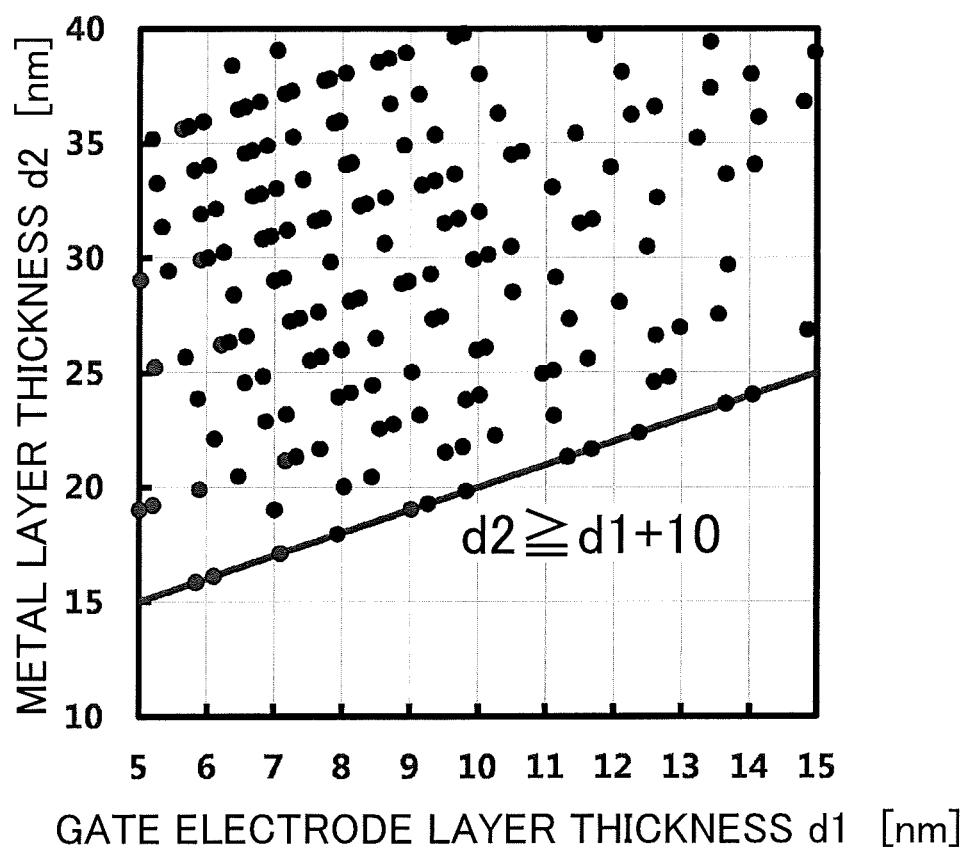
FIG. 13 is a graph for explaining the function and effect of the semiconductor memory device of the embodiment.

FIG. 13 is a graph for explaining the function and effect of the semiconductor memory device of the embodiment. FIG. 13 shows conditions for satisfying MWv≥MWp when the ferroelectric layer 18 contains hafnium oxide as the main component. By comprehensively changing Ec, $t_{FE}$, Pr, and ε, conditions for satisfying MWv≥MWp were determined. As shown in FIG. 13, MWv≥MWp is satisfied by the first thickness d1 (nm) of the word line WL in the z direction and the second thickness d2 (nm) of the metal layer 16 in the z direction satisfying the following inequality:

$$d2 \geq d1 + 10$$

Thus, when the ferroelectric layer 18 contains hafnium oxide as the main component, it is preferable from the viewpoint of weakening the depolarization electric field and improving the charge retention characteristics that the first thickness d1 (nm) of the word line WL in the z direction and the second thickness d2 (nm) of the metal layer 16 in the z direction satisfy the following inequality:

$$d2 \geq d1 + 10$$

In the semiconductor memory device of the embodiment, the gate insulating layer 14 is provided without being divided between the memory cell transistors MT adjacent to each other. In other words, the gate insulating layer 14 is also present on both sides of the end of each metal layer 16. Consequently, an electric field wrapping around from the end of each metal layer 16 effectively increases the area of the MIS capacitor formed of the metal layer 16, the gate insulating layer 14, and the semiconductor layer 10. Thus, the MFM capacitor area/the MIS capacitor area is smaller than that when the gate insulating layer 14 is divided between the adjacent memory cell transistors MT. Therefore, the depolarization electric field is weakened, and the charge retention characteristics are improved.

Further, since the gate insulating layer 14 is not processed at the ends of the metal layers 16, the reliability of the gate insulating layer 14 is improved, compared to the case where the gate insulating layer 14 is divided between the adjacent memory cell transistors MT.

In the semiconductor memory device of the embodiment, regions of each ferroelectric layer 18 sandwiched between the word line WL and the interlayer insulating layers 12 are the paraelectric regions 18b of the paraelectric. When formed of the same material, the paraelectric has a dielectric constant lower than the dielectric constant of the ferroelectric. Consequently, compared to the case where the regions sandwiched between the word lines WL and the interlayer insulating layers 12 are the ferroelectric, the capacitance between the word lines WL is reduced, and the parasitic capacitance of the word lines WL is reduced. Therefore, a low-power-consumption high-speed semiconductor memory device can be provided.

In the semiconductor memory device of the embodiment, the width(length) of each metal layer 16 in the y direction (w in FIG. 3) is preferably substantially constant. Preferably, each metal layer 16 is not present in the first direction of the end of the word line WL near the semiconductor layer 10. Preferably, each metal layer 16 is not present between the word line WL and the interlayer insulating layers 12. The above configuration can reduce an increase in the MFM capacitor area/the MIS capacitor area. Therefore, the depolarization electric field is weakened, and the charge retention characteristics are improved. In addition, the capacitance between the word lines WL is reduced, and the parasitic capacitance of the word lines WL is reduced. Therefore, a low-power-consumption high-speed semiconductor memory device can be provided.

As described above, according to the semiconductor memory device of the embodiment, the depolarization electric field is weakened, and the charge retention characteristics are improved. Therefore, a semiconductor memory device that can be improved in reliability can be provided.

The embodiment has been described with the case where the ferroelectric layers 18 are hafnium oxide as an example. The ferroelectric layers 18 can use another ferroelectric such as lead zirconate titanate (PZT), bismuth strontium tantalate (SBT), barium titanate (BTO), or polyvinylidene fluoride (PVDF).

The embodiment has been described with the case where the interlayer insulating layers 12 are provided between the word lines WL as an example. Spaces between the word lines WL may be, for example, cavities.

While certain embodiments have been described, these embodiments have been presented by way of example only, and are not intended to limit the scope of the inventions. Indeed, the semiconductor memory device described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A semiconductor memory device comprising:
a stacked body including interlayer insulating layers and gate electrode layers alternately stacked in a first direction;
a semiconductor layer provided in the stacked body and extending in the first direction;
a first insulating layer provided between the semiconductor layer and the gate electrode layers;
conductive layers provided between the first insulating layer and the gate electrode layers; and
second insulating layers provided between the conductive layers and the gate electrode layers and the second insulating layers containing ferroelectrics,
wherein two of the conductive layers adjacent to each other in the first direction are separated by one of the interlayer insulating layers interposed between the two of the conductive layers, and
a first thickness of one of the gate electrode layers in the first direction is smaller than a second thickness of one of the conductive layers in the first direction.

2. The semiconductor memory device according to claim 1, wherein one of the second insulating layers includes a first region between the one of the conductive layers and the one of the gate electrode layers, and the one of the second insulating layers includes a second region between the one of the gate electrode layers and one of the interlayer insulating layers.

3. The semiconductor memory device according to claim 2, wherein the first region contains the ferroelectrics, and the second region contains paraelectrics.

4. The semiconductor memory device according to claim 2, wherein the first region contains an orthorhombic crystal, and the second region contains a monoclinic crystal.

5. The semiconductor memory device according to claim 1, wherein the second insulating layers contain hafnium oxide.

6. The semiconductor memory device according to claim 5, wherein following inequality is satisfied, where d1 (nm) is the first thickness, and d2 (nm) is the second thickness.

$$d2 \geq d1+10.$$

7. The semiconductor memory device according to claim 1, wherein the first insulating layer is provided between the semiconductor layer and the interlayer insulating layers.

8. The semiconductor memory device according to claim 1, wherein a length of the one of the conductive layers in a second direction orthogonal to the first direction is substantially constant.

9. The semiconductor memory device according to claim 1, wherein the conductive layers contain at least one material selected from a group consisting of titanium (Ti), tungsten (W), tantalum (Ta), titanium nitride, tungsten nitride, tantalum nitride, titanium carbide, tungsten carbide, and tantalum carbide.

10. A semiconductor memory device comprising:
a stacked body including interlayer insulating layers and gate electrode layers alternately stacked in a first direction;
a semiconductor layer provided in the stacked body and extending in the first direction;
a first insulating layer provided between the semiconductor layer and the gate electrode layers;
conductive layers provided between the first insulating layer and the gate electrode layers; and
second insulating layers provided between the conductive layers and the gate electrode layers, one of the second insulating layers including a first region between one of the conductive layers and one of the gate electrode layers and the one of the second insulating layers including a second region between the one of the gate electrode layers and one of the interlayer insulating layers, and the second insulating layers containing ferroelectrics,
wherein a first thickness of the one of the gate electrode layers in the first direction is smaller than a second thickness of the one of the conductive layers in the first direction.

11. The semiconductor memory device according to claim 10, wherein the first region contains the ferroelectrics, and the second region contains paraelectrics.

12. The semiconductor memory device according to claim 10, wherein the first region contains an orthorhombic crystal, and the second region contains a monoclinic crystal.

13. The semiconductor memory device according to claim 10, wherein the second insulating layers contain hafnium oxide.

14. The semiconductor memory device according to claim 13, wherein following inequality is satisfied, where d1 (nm) is the first thickness, and d2 (nm) is the second thickness.

$$d2 \geq d1+10.$$

15. A semiconductor memory device comprising:
a plurality of gate electrode layers disposed in a first direction;
a semiconductor layer extending in the first direction;
a first insulating layer provided between the semiconductor layer and the gate electrode layers;
conductive layers provided between the first insulating layer and the gate electrode layers; and
second insulating layers provided between the conductive layers and the gate electrode layers and the second insulating layers containing ferroelectrics,
wherein two of the conductive layers adjacent to each other in the first direction are separated, and
a first thickness of one of the gate electrode layers in the first direction is smaller than a second thickness of one of the conductive layers in the first direction.

16. The semiconductor memory device according to claim 15, wherein one of the second insulating layers includes a first region between the one of the conductive layers and the one of the gate electrode layers, and the one of the second insulating layers includes a second region located in the first direction of the one of the gate electrode layers.

17. The semiconductor memory device according to claim 16, wherein the first region contains the ferroelectrics, and the second region contains paraelectrics.

18. The semiconductor memory device according to claim 16, wherein the first region contains an orthorhombic crystal, and the second region contains a monoclinic crystal.

19. The semiconductor memory device according to claim 15, wherein the second insulating layers contain hafnium oxide.

20. The semiconductor memory device according to claim 19, wherein following inequality is satisfied, where d1 (nm) is the first thickness, and d2 (nm) is the second thickness.

$$d2 \geq d1+10.$$

* * * * *